(12) United States Patent
Kim et al.

(10) Patent No.: US 9,870,991 B1
(45) Date of Patent: Jan. 16, 2018

(54) SEMICONDUCTOR DEVICE

(71) Applicant: SK hynix Inc., Icheon-si, Gyeonggi-do (KR)

(72) Inventors: Do Youn Kim, Icheon-si (KR); Hyoung Soon Yune, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/458,330

(22) Filed: Mar. 14, 2017

(30) Foreign Application Priority Data

Sep. 2, 2016 (KR) .................. 10-2016-0113290

(51) Int. Cl.
| | | |
|---|---|---|
| *H01L 27/115* | (2017.01) | |
| *H01L 23/528* | (2006.01) | |
| *H01L 27/1157* | (2017.01) | |
| *H01L 27/11582* | (2017.01) | |
| *H01L 23/522* | (2006.01) | |

(52) U.S. Cl.
CPC ........ *H01L 23/528* (2013.01); *H01L 23/5226* (2013.01); *H01L 27/1157* (2013.01); *H01L 27/11582* (2013.01)

(58) Field of Classification Search
CPC ............... H01L 23/528; H01L 23/5226; H01L 27/1157; H01L 27/11582
See application file for complete search history.

(56) References Cited

U.S. PATENT DOCUMENTS

| | | | |
|---|---|---|---|
| 2013/0130468 A1 | 5/2013 | Higashitani et al. | |
| 2016/0086964 A1* | 3/2016 | Chien ............... | H01L 27/11556 257/314 |
| 2017/0110464 A1* | 4/2017 | Rabkin ............... | H01L 27/1157 |

FOREIGN PATENT DOCUMENTS

KR  1020120026435 A  3/2012

* cited by examiner

*Primary Examiner* — Jarrett Stark
(74) *Attorney, Agent, or Firm* — William Park & Associates Ltd.

(57) ABSTRACT

A semiconductor device may be provided. The semiconductor device may include conductive patterns surrounding a channel film. The conductive patterns may be stacked and spaced apart from one another. The semiconductor device may include a gate contact plug coupled to one of the conductive patterns. The semiconductor device may include support pillars penetrating the conductive patterns in a periphery of the gate contact plug.

15 Claims, 15 Drawing Sheets

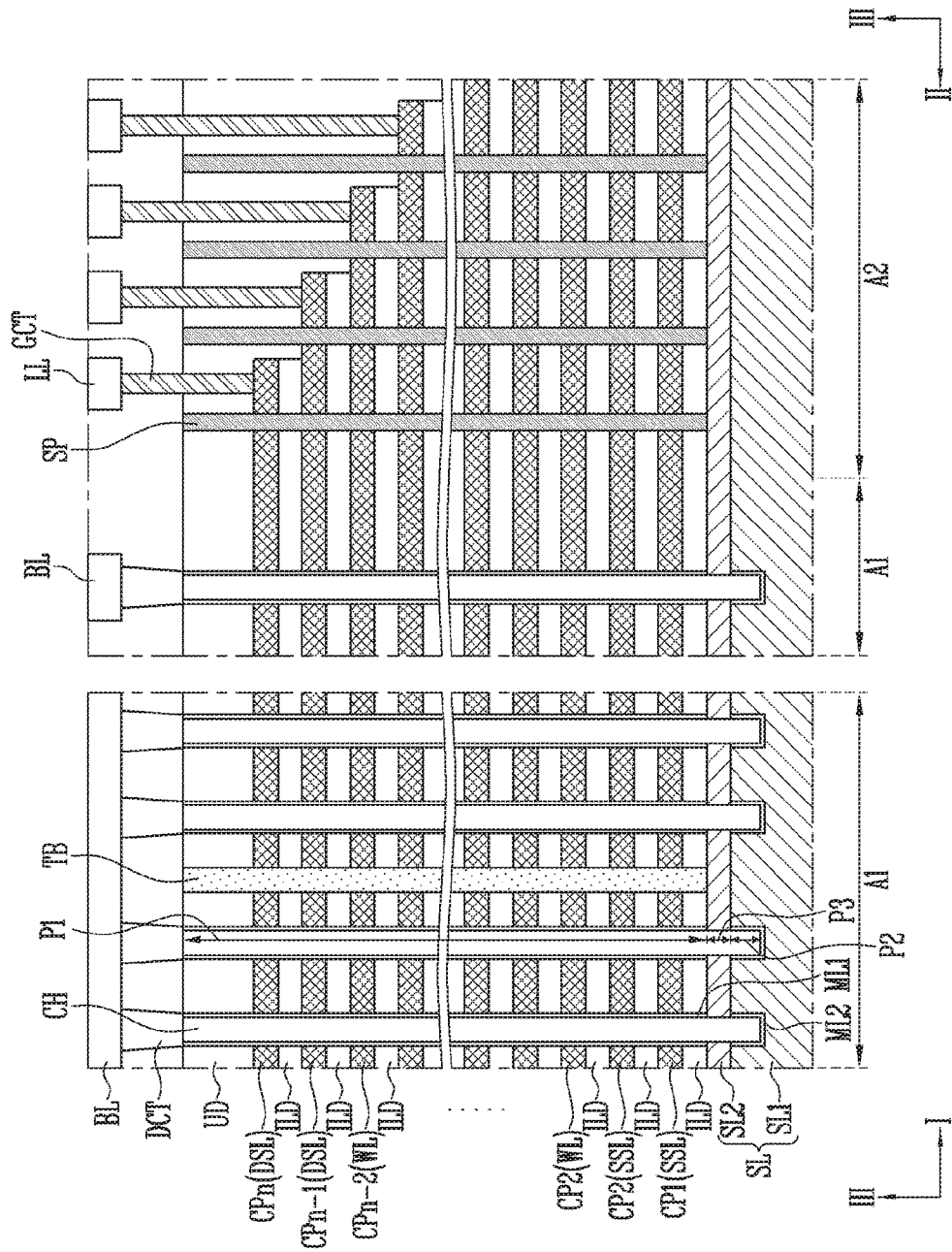

SEMICONDUCTOR DEVICE

CROSS-REFERENCE TO RELATED APPLICATION

The present application claims priority under 35 U.S.C. §119(a) to Korean patent application number 10-2016-0113290 filed on Sep. 2, 2016 in the Korean Intellectual Property Office, the entire disclosure of which is incorporated herein by reference.

BACKGROUND

1. Technical Field

Various embodiments of the present disclosure may generally relate to a semiconductor device, and more particularly to, a semiconductor device including a stacked body.

2. Related Art

To improve the degree of integration of semiconductor devices, the semiconductor device may be formed in various structures. For example, a three-dimensional semiconductor memory device may include memory cells arranged in a three-dimensional structure. Thus, the three-dimensional semiconductor memory device may increase the number of memory cells arranged in a unit area of a substrate.

A three-dimensional semiconductor memory device consist of a stacked body including interlayer insulating films and conductive patterns alternately stacked, a channel film passing through the stacked body, and a memory film formed between the channel film and each conductive pattern. In order to improve the degree of integration of the three-dimensional semiconductor memory device, the number of stacked memory cells may be increased. In such a case, a height of the stacked body increases. When the height of the stacked body increases, it may be difficult to ensure the structural stability.

SUMMARY

According to an embodiment of the present disclosure, a semiconductor device may be provided. The semiconductor device may include conductive patterns surrounding a channel film. The conductive patterns may be stacked and spaced apart from one another. The semiconductor device may include a gate contact plug coupled to one of the conductive patterns. The semiconductor device may include support pillars penetrating the conductive patterns in a periphery of the gate contact plug.

BRIEF DESCRIPTION OF THE DRAWINGS

FIG. 1A is a cross-sectional view illustrating a semiconductor device according to an embodiment of the present disclosure.

DETAILED DESCRIPTION

Hereinafter, examples of embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the examples of embodiments to those skilled in the art.

Embodiments of the present disclosure may provide for a semiconductor device capable of enhancing structural stability of a stacked body.

Figure 1B:
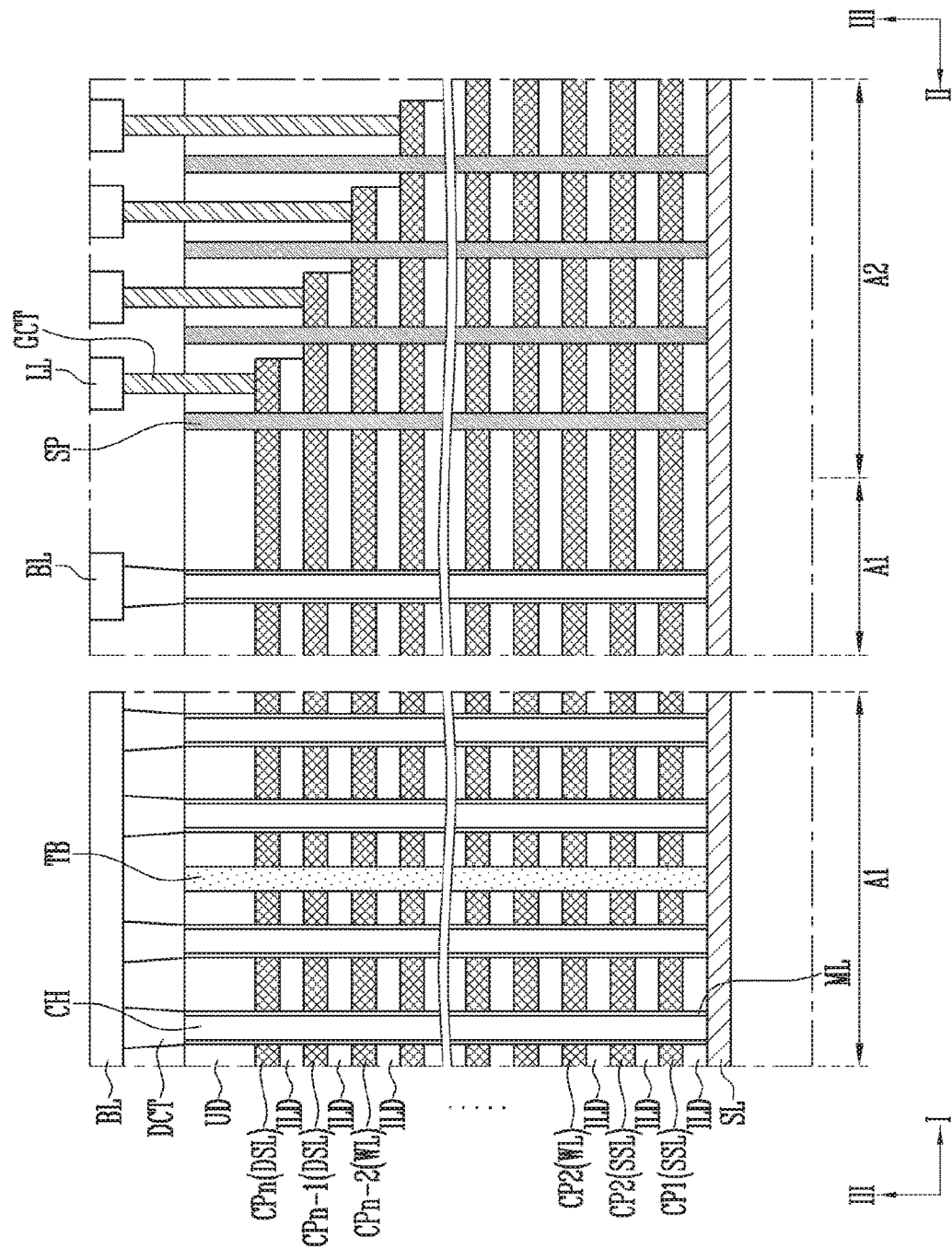
FIG. 1B is a cross-sectional view illustrating a semiconductor device according to an embodiment of the present disclosure.
Figure 1C:
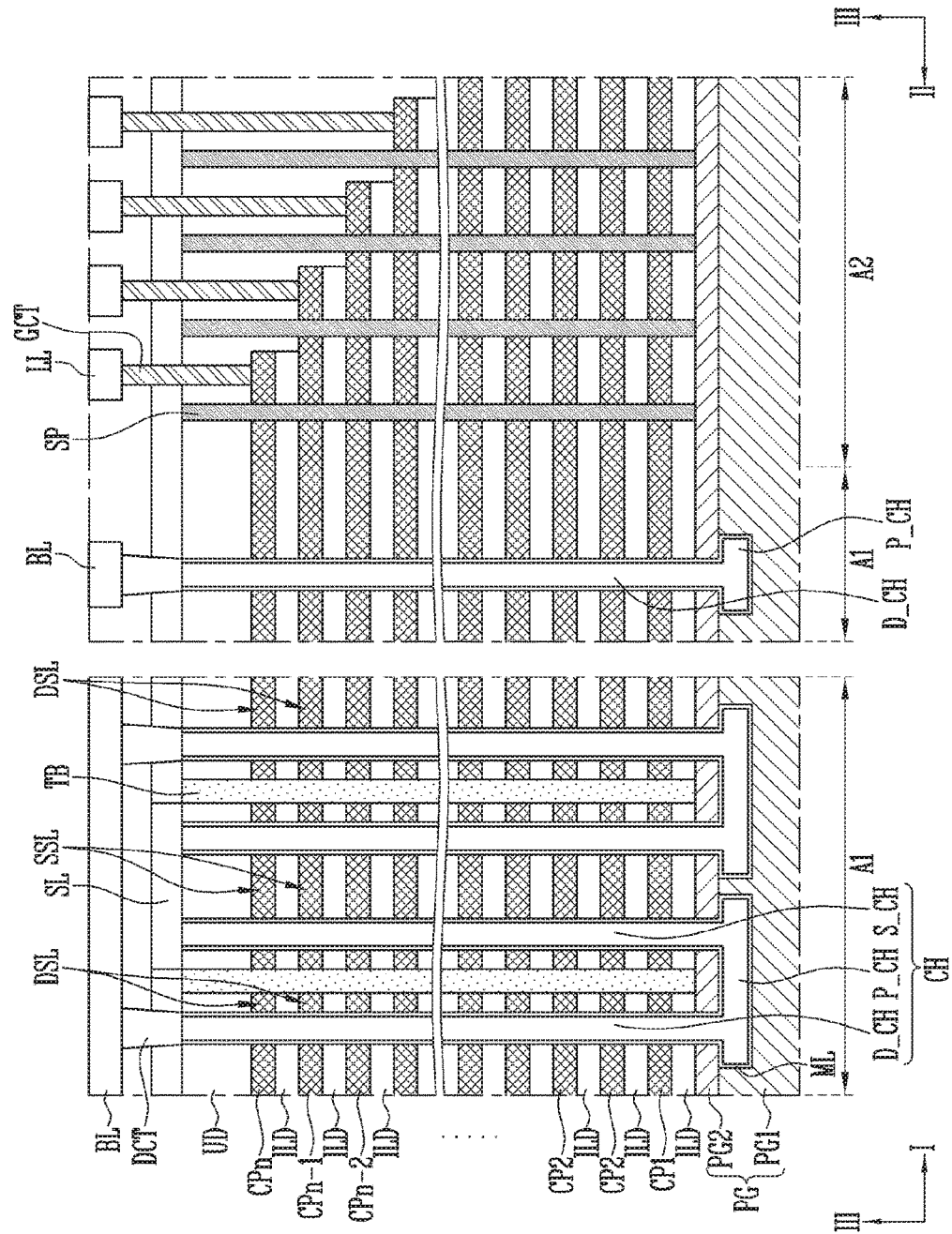
FIG. 1C is a cross-sectional view illustrating a semiconductor device according to an embodiment of the present disclosure.

FIGS. 1A to 1C are cross-sectional views illustrating a semiconductor device according to embodiments of the present disclosure.

FIGS. 1A to 1C each illustrate a cross-section taken along a first direction I and a cross-section taken along a second direction II of the semiconductor device. The first direction I may be an extension direction of a bit line BL and the second direction II may intersect the first direction I.

Referring to FIGS. 1A to 1C, a semiconductor device may include a cell area A1 and a contact area A2. A plurality of memory strings may be arranged in the cell area A1. Gate contact plugs GCT may be disposed in the contact area A2.

Each of the memory strings may include memory cells and select transistors coupled in series by a channel film CH. The structures of the memory cells and the select transistors will be described below.

The channel film CH may be formed in a straight type channel hole as illustrated in FIGS. 1A and 1B, or may be formed in a U shaped channel hole as shown in FIG. 1C. Alternatively, the channel film CH may be formed in channel holes of various shapes such as a W shaped channel hole, etc. The channel film CH may include a liner semiconductor film surrounding a core insulating film disposed in a central area of a channel hole. The channel film CH may include a pillar type semiconductor film which completely fills a central area of the channel hole.

Referring to FIG. 1C, the channel film CH in the U shaped channel hole may include a pipe channel film P_CH, a drain side channel film D_CH, and a source side channel film S_CH. The drain side channel film D_CH and the source side channel film S_CH may extend from the pipe channel film P_CH along a third direction III. The third direction III may perpendicularly intersect the plane extending along the first direction I and the second direction II.

Referring to FIGS. 1A to 1C, an outer wall of the channel film CH may be surrounded by a multilayer pattern ML1, ML2, or ML used as a memory film.

For example, as illustrated in FIG. 1A, the outer wall of the channel film CH may be surrounded by a first multilayer pattern ML1 and a second multilayer pattern ML2. The channel film CH may include a first portion P1 surrounded by the first multilayer pattern ML1, a second portion P2 surrounded by the second multilayer pattern ML2, and a third portion P3 between the first portion P1 and second portion P2. As illustrated in FIG. 1B, the multilayer pattern ML may extend along the entire surface of a sidewall of the channel film CH. As illustrated in FIG. 1C, the multilayer pattern ML may extend along the entire outer walls of the pipe channel film P_CH, the drain side channel film D_CH, and the source side channel film S_CH.

Although not illustrated in FIGS. 1A to 1C, the multilayer pattern ML1, ML2, or ML described above may include a tunnel insulating film adjacent to the channel film CH, a data storage film surrounding the tunnel insulating film, and a blocking insulating film surrounding the data storage film. The tunnel insulating film may be formed of an insulating material capable of charge tunneling. The data storage film may be formed of a material film capable of storing charges. The blocking insulating film may be formed of an insulating material capable of blocking charges. For example, the tunnel insulating film may include a silicon oxide film, the data storage film may include a silicon nitride film, and the blocking insulating film may include a silicon oxide film.

Referring to FIGS. 1A to 1C, the channel film CH may be electrically connected to a bit line BL and a common source line SL. The bit line BL and the common source line SL may be formed of a conductive material.

Referring to FIG. 1A, the bit line BL may be disposed above the channel film CH, and the common source line SL may cover sidewalls of the second portion P2 and the third portion P3 of the channel film CH. The bit line BL may be electrically coupled to the channel film CH via a drain contact plug DCT or may be directly coupled to the channel film CH. The common source line SL may be formed in a stacked structure of a first source film SL1 and a second source film SL2. The first source film SL1 may include a groove portion filled with the second portion P2 of the channel film CH. The second multilayer pattern ML2 may be formed between the first source film SL1 and the second portion P2 of the channel film CH. The second source film SL2 may surround the third portion P3 of the channel film CH while directly contacting the third portion P3 of the channel film CH. The second source film SL2 may separate the first multilayer pattern ML1 from the second multilayer pattern ML2. The common source line SL may be electrically connected to the channel film CH by the second source film SL2 contacting the channel film CH.

Referring to FIG. 1B, the bit line BL may be disposed above the channel film CH, and the common source line SL may be disposed below the channel film CH. The bit line BL may be electrically connected to the channel film CH via the drain contact plug DCT or may be directly coupled to the channel film CH. The common source line SL may be a portion of a semiconductor substrate or a conductive film stacked on the semiconductor substrate. The common source line SL may include a doped silicon film. The common source line SL may be coupled to a lower end of the channel film CH.

Referring to FIG. 1C, the bit line BL and the common source line SL may be disposed above the channel film CH. The bit line BL may be disposed on a different layer from the common source line SL. For example, the bit line BL may be disposed above the common source line SL. The bit line BL may be coupled to the channel film CH via the drain contact plug DCT. Although not illustrated in FIG. 1C, the bit line BL may be directly coupled to the channel film CH. The bit line BL may be coupled to the drain side channel film D_CH. The common source line SL may be directly coupled to the channel film CH or may be coupled to the channel film CH via a source contact plug. The common source line SL may be coupled to the source side channel film S_CH.

Referring to FIGS. 1A to 1C, the channel film CH may be surrounded by interlayer insulating films ILD and conductive patterns CP1 to CPn alternately stacked. The conductive patterns CP1 to CPn may extend along the second direction II. The conductive patterns CP1 to CPn may extend from the cell area A1 to the contact area A2. The conductive patterns CP1 to CPn may be stacked in a stepped structure in the contact area A2. The conductive patterns CP1 to CPn may be spaced apart from one another by the interlayer insulating films ILD. The conductive patterns CP1 to CPn may be coupled to gate patterns of the memory string. The conductive patterns CP1 to CPn may be penetrated by a trench buried film TB. The conductive patterns CP1 to CPn may be penetrated by support pillars SP. The range in which the support pillars SP are formed may be limited so as not to separate each of the conductive patterns CP1 to CPn into a plurality of patterns. In addition, the support pillars SP may be surrounded by the conductive patterns CP1 to CPn.

The conductive patterns CP1 to CPn may be coupled to the gate contact plugs GCT, respectively. The gate contact plugs GCT may be in contact with the conductive patterns CP1 to CPn and extend along the third direction III. The gate contact plugs GCT may extend to penetrate an upper insulating film UD. The upper insulating film UD may cover the conductive patterns CP1 to CPn and have a planarized surface. The gate contact plugs GCT may be in contact with connection structures LL. The connection structures LL may be formed of a conductive material, used as a connection pad, a signal transmission line, or a contact pattern.

Referring to FIGS. 1A and 1B, the conductive patterns CP1 to CPn may be arranged to surround the channel film CH between the bit line BL and the common source line SL. One conductive pattern CP1 or two or more conductive patterns (e.g., the conductive patterns CP1 and CP2) adjacent to the common source line SL among the conductive patterns CP1 to CPn may be used as source select lines SSL. One conductive pattern CPn or two or more conductive patterns (e.g., conductive patterns CPn and CPn−1) adjacent to the bit line BL among the conductive patterns CP1 to CPn may be used as drain select lines DSL. Conductive patterns (e.g., conductive patterns CP3 to CPn−2) between the source select lines SSL and the drain select lines DSL may be used as word lines WL.

Referring to FIG. 1C, the conductive patterns CP1 to CPn may be stacked under the bit line BL and the common source line SL to cover the sidewall of the channel film CH. The conductive patterns CP1 to CPn may be separated into a drain side stacked body that surrounds the drain side channel film D_CH and a source side stacked body that surrounds the source side channel film S_CH by the trench buried film TB. One conductive pattern CPn or two or more conductive patterns (e.g., conductive patterns CPn and CPn−1) adjacent to the bit line BL among the conductive patterns CP1 to CPn surrounding the drain side channel film D_CH may be used as the drain select lines DSL. One conductive pattern CPn or two or more conductive patterns CPn and CPn−1 adjacent to the common source line CSL among the conductive patterns CP1 to CPn surrounding the source side channel film S_CH may be used as the source select lines SSL. The conductive patterns (e.g., conductive patterns CP1 to CPn−2) under the source select lines SSL and the drain select lines DSL may be used as the word lines WL.

A U shaped channel film CH may be surrounded by a pipe gate PG disposed under the conductive patterns CP1 to CPn. The pipe gate PG may be formed in a stacked structure of a first pipe gate PG1 and a second pipe gate PG2. The first pipe gate PG1 may surround a side wall and a bottom surface of the pipe channel film P_CH and the second pipe gate PG2 may cover an upper surface of the pipe channel film P_CH. The second pipe gate PG2 may be penetrated by the source side channel film S_CH and the drain side channel film D_CH. A pipe transistor may include the pipe gate PG serving as a gate, the pipe channel film P_CH used as a channel, and the multilayer pattern ML serving as a gate insulating film. The pipe transistor may control electrical connection between the source side channel film S_CH and the drain side channel film D_CH.

Referring to FIGS. 1A to 1C, the source select line SSL may be coupled to a gate of a source select transistor, the drain select line DSL may be coupled to a gate of a drain select transistor, and the word lines WL may be coupled to gates of the memory cells. According to structures shown in FIGS. 1A to 1C, the source select transistor may include a gate coupled to the source select line SSL, the channel film CH surrounded by the source select line SSL, and the multilayer pattern ML1 or ML between the channel film CH and the source select line SSL. The drain select transistor may include a gate coupled to the drain select line DSL, the channel film CH surrounded by the drain select line DSL, and the multilayer pattern ML1 or ML between the channel film CH and the drain select line DSL. The memory cell may include a gate coupled to the word line WL, the channel film CH surrounded by the word line WL, and the multilayer pattern ML1 or ML between the channel film CH and the word line WL.

Figure 2:
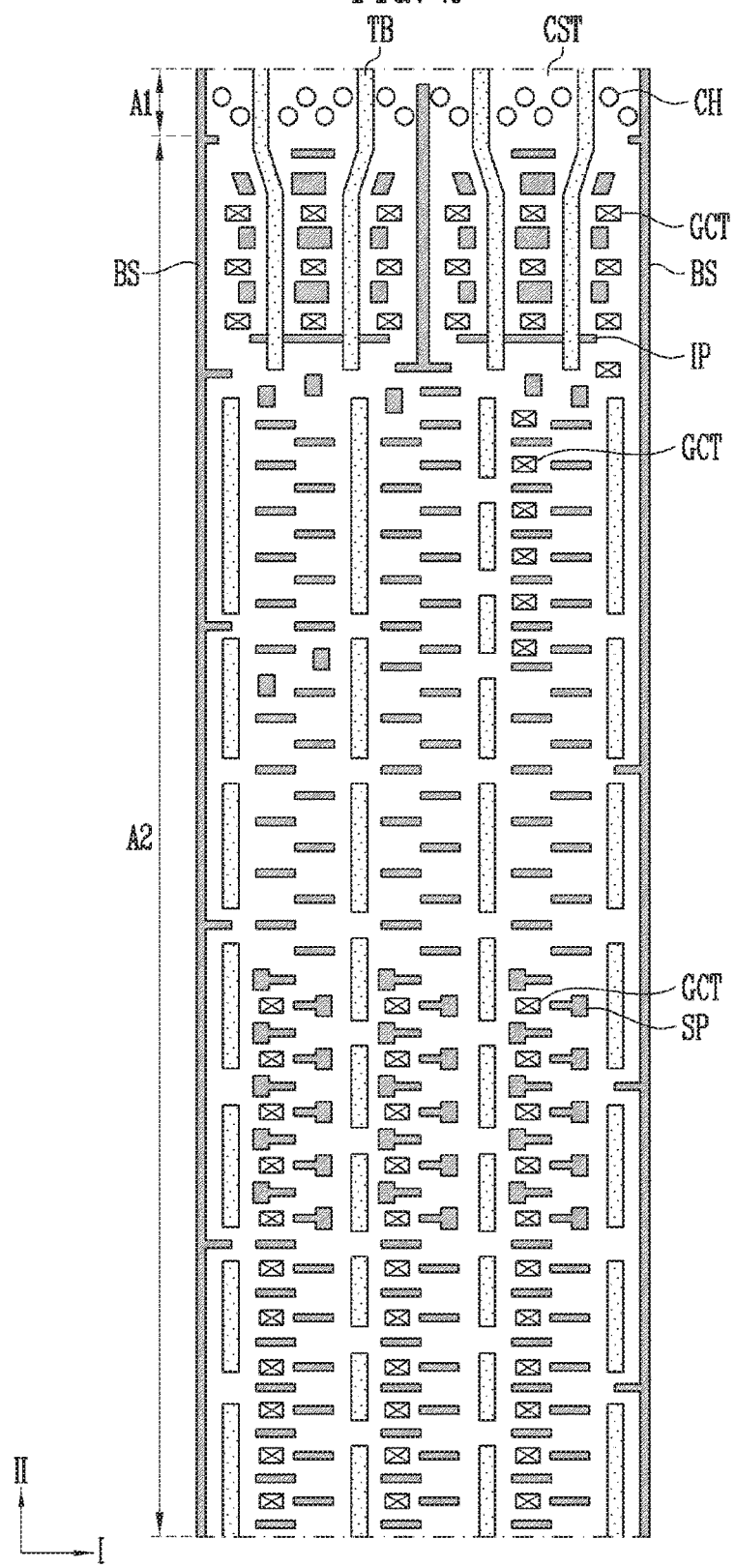
FIG. 2 is a plan view illustrating a contact area of a semiconductor device according to an embodiment of the present disclosure.

FIG. 2 is a plan view illustrating a contact area of a semiconductor device according to an embodiment of the present disclosure. FIG. 2 illustrates a structure applicable to one of the semiconductor devices of FIGS. 1A to 1C.

Referring to FIG. 2, the semiconductor device may include a stack CST of the conductive patterns extending from the cell area A1 to the contact area A2 and the gate contact plugs GCT coupled to the stack CST of the conductive patterns. The stack CST of the conductive patterns may include the conductive patterns CP1 to CPn described in FIG. 1A, 1B, or 1C. The gate contact plugs GCT may have the same vertical cross-section structure as the gate contact plugs GCT described above with reference to FIG. 1A, 1B, or 1C.

The stack CST of the conductive patterns may be divided into a plurality of blocks by a block separation film BS. The stack CST of the conductive patterns may be penetrated by the channel films CH in the cell area A1. The stack CST of the conductive patterns may be penetrated by the support pillars SP in the contact area A2. The stack CST of the conductive patterns may be penetrated by the trench buried films TB in the cell area A1 and the contact area A2. The stack CST of the conductive patterns may be patterned in a stepped structure along the first direction I and the second direction II intersecting each other. The stepped structure formed along the first direction I and the second direction II may be described below with reference to FIG. 5A.

The trench buries films TB may be disposed between the channel films CH in the cell area A1. The trench buried films TB disposed in the cell area A1 may extend to the contact area A2. The trench buried films TB extending from the cell area A1 to the contact area A2 and adjacent to one another may be coupled to one another by a crossing separation film IP intersecting the trench buried films TB.

The trench buried films TB may be spaced apart from one another in the contact area A2 along the first direction I and the second direction II. The trench buried films TB disposed in the contact area A2 may be formed in a line type extending along the second direction II.

The support pillars SP and the gate contact plugs GCT may be disposed between the trench buried films TB facing each other in the first direction I. The gate contact plugs GCT may be arranged in a line along the second direction II between the trench buried films TB facing each other in the first direction I. The support pillars SP may be disposed in a periphery of the gate contact plugs GCT and formed into various shapes to provide a stable support structure.

FIGS. 3A to 3K are plan views illustrating support pillars according to an embodiment of the present disclosure.

Referring to FIGS. 3A to 3E, first, second, and third support pillars SP1, SP2 and SP3 may be disposed in a periphery of one gate contact plug GCT disposed between a first trench buried film TB1 and a second trench buried film TB2 facing each other in the first direction I. The cross-section of at least one of the first to third support pillars SP1 to SP3 may have a T shape or a substantially T shape to provide a stable support structure.

The gate contact plug GCT may be formed closer to the second trench buried film TB2 than the first trench buried film TB1. Accordingly, a third support pillar SP3 may be disposed between the first trench buried film TB1 and the gate contact plug GCT having a relatively wider gap. The first support pillar SP1 and the second support pillar SP2 may be face each other in the second direction II with the gate contact plug GCT interposed therebetween.

Figure 3A:
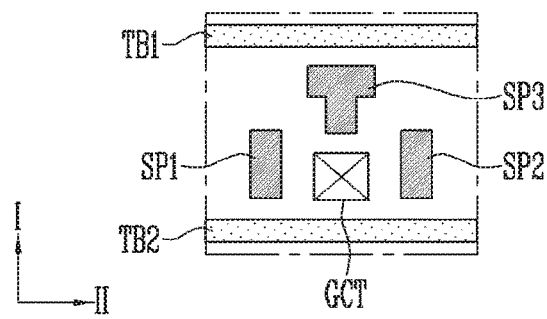
FIGS. 3A to 3K are plan views illustrating support pillars according to embodiments of the present disclosure.
Figure 3B:
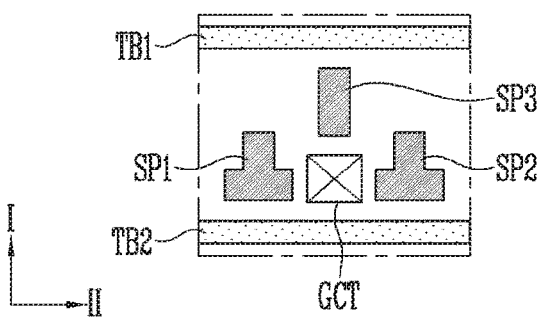
Figure 3C:
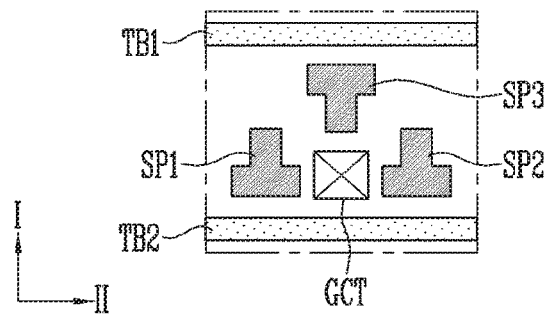
Figure 3D:
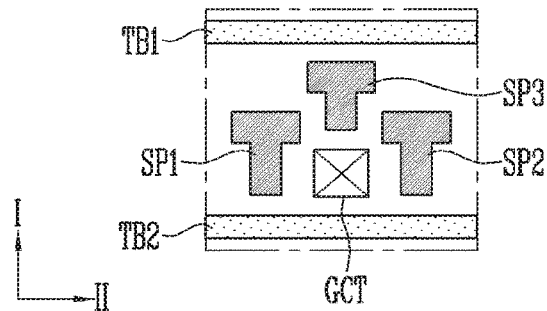
Figure 3E:
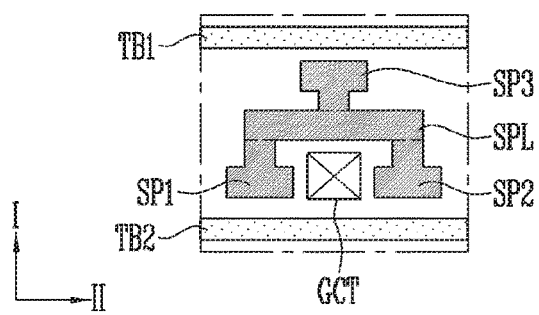

The first to third support pillars SP1 to SP3 may be spaced apart from one another as illustrated in FIGS. 3A to 3D. The first to third support pillars SP1 to SP3 may be coupled to one another via a connection unit SPL as illustrated in FIG. 3E. The connection unit SPL may be disposed between the gate contact plug GCT and the third support pillar SP3 and extend to be coupled to the first to third support pillars SP1 to SP3.

Referring to FIGS. 3F to 3J, the gate contact plug GCT disposed between the first trench buried film TB1 and the second trench buried film TB2 facing each other in the first direction I may be surrounded by a support pillar structure having an opened one side. For example, the cross-section of the support pillar structure may be formed in a C, V, U or Y shape to provide a stable support structure. For example, the cross-section of the support pillar structure may substantially be formed in a C, V, U or Y shape to provide a stable support structure. The first to third support pillars SP1 to SP3 and the at least one connection unit SPL disposed in a periphery of the gate contact plug GCT may be coupled to one another to have a C, V, U, or Y shaped cross-section or a substantially C, V, U, or Y shaped cross-section. The C, V, U, or Y shaped support pillar may be arranged such that an opening may be toward the second trench buried film TB2.

The arrangement of the first trench buried film TB1, the second trench buried film TB2, the gate contact plug GCT, and the first to third support pillars SP1 to SP3 is the same as that illustrated in FIGS. 3A to 3E.

Figure 3F:
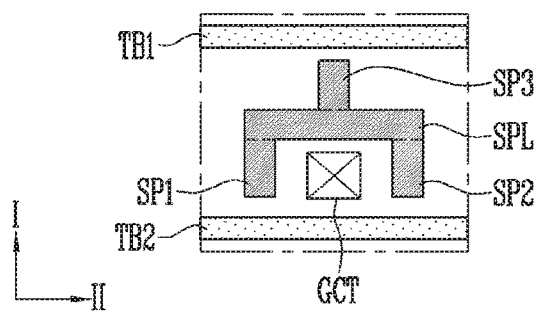
Figure 3G:
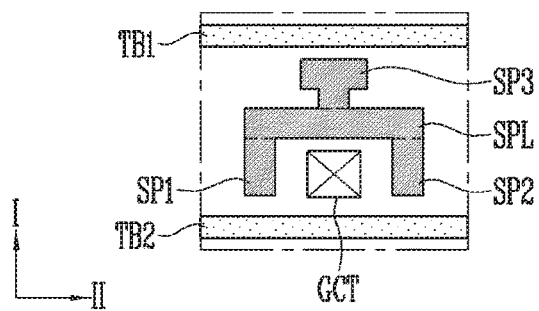

Referring to FIGS. 3F and 3G, the connection unit SPL may extend to connect the first to third support pillars SP1 to SP3. The connection unit SPL may be disposed between the third support pillar SP3 and the gate contact plug GCT. Each of the first to third support pillars SP1 to SP3 may not have a T shape as illustrated in FIG. 3F, but may be a bar shape extending in one direction. Alternatively, at least one of the first to third support pillars SP1 to SP3 may be formed having a T shape or a substantially T shape as illustrated in FIG. 3G to provide a more stable support structure.

Figure 3H:
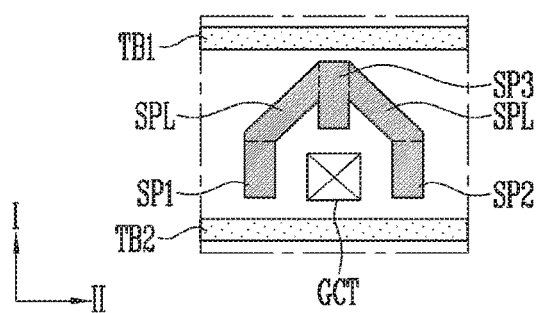

Referring to FIG. 3H, the connection units SPL may connect the first support pillar SP1 with the third support pillar SP3 and the second support pillar SP2 with the third support pillar SP3. The third support pillar SP3 may protrude toward the gate contact plug GCT.

Figure 3I:
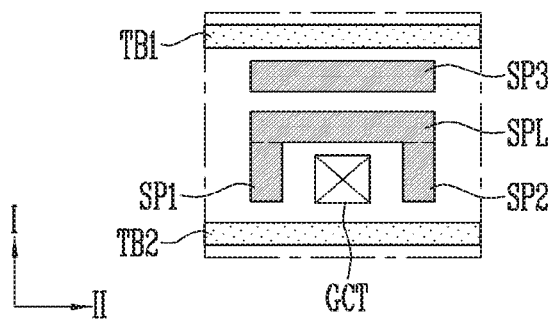
Figure 3J:
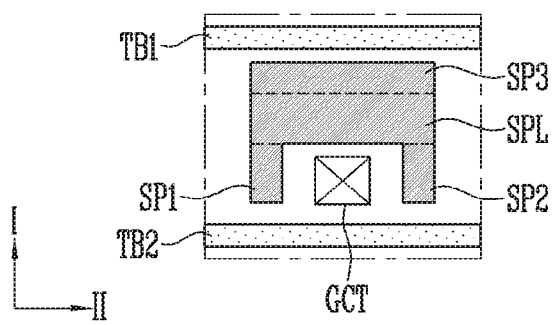

Referring to FIGS. 3I and 3J, the connection unit SPL may extend to connect the first support pillar SP1 with the second support pillar SP2. The third support pillar SP3 may extend to be parallel to or substantially parallel to the connection unit SPL. The connection unit SPL may be spaced apart from the third support pillar SP3 as illustrated in FIG. 3I. The connection unit SPL may be extended to be coupled to the third support pillar SP3 as illustrated in FIG. 3J.

Figure 3K:
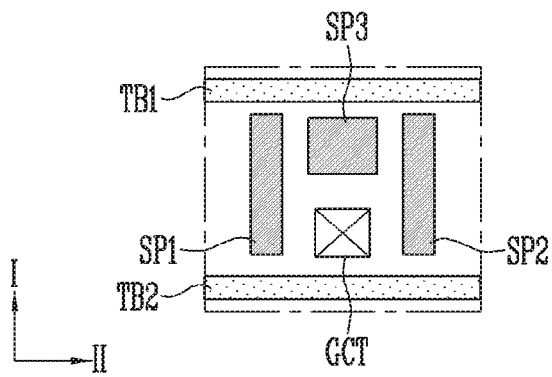

Referring to FIG. 3K, the first to third support pillars SP1 to SP3 may be spaced apart from one another in the periphery of the gate contact plug GCT disposed between the first trench buried film TB1 and the second trench buried film TB2 facing each other in the first direction I. The arrangement of the first trench buried film TB1, the second trench buried film TB2, the gate contact plug GCT and the first to third support pillars SP1 to SP3 may be the same as that described in each of FIGS. 3A to 3E. The first to third support pillars SP1 to SP3 may have various areas to provide a stable support structure. For example, each of the first support pillar SP1 and the second support pillar SP2 may be a bar type extending from one end adjacent to the first trench buried film TB1 to the second trench buried film TB2. The third support pillar SP3 may be disposed between the first support pillar SP1 and the second support pillar SP2 and have a greater width in the second direction II than the first support pillar SP1 and the second support pillar SP2.

FIGS. 4A to 4D are plan views illustrating trench buried films and support pillars illustrating an embodiment of the present disclosure.

Referring to FIGS. 4A to 4D, the first trench buried films TB1 and the second trench buried films TB2 facing each other in the first direction I may be extended to have various lengths. For example, each of the first trench buried film TB1 and the second trench buried film TB2 may extended to a first length to face the first to third gate contact plugs CT1, CT2, and CT3 arranged sequentially in the second direction II. Each of the first trench buried films TB1 and the second trench buried films TB2 may be extended to a second length to face the first and second gate contact plugs CT1 and CT2 arranged sequentially in the second direction II. The second length may be smaller than the first length.

The first to third support pillars SP1 to SP3 may be disposed in a periphery of each of the gate contact plugs CT1, CT2, and CT3. The arrangement of the first trench buried films TB1, the second trench buried films TB2, the gate contact plugs CT1 to CT3, and the first to third support pillars SP1 to SP3 may be the same as that illustrated in each of FIGS. 3A to 3E.

Figure 4A:
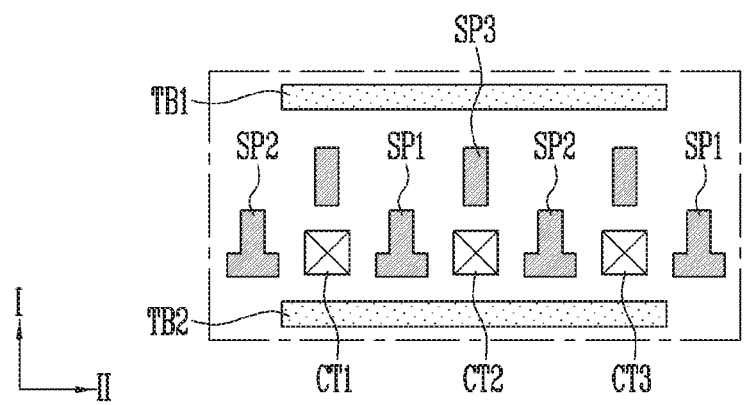
FIGS. 4A to 4D are plan views illustrating trench buried films and support pillars according to embodiments of the present disclosure.
Figure 4B:
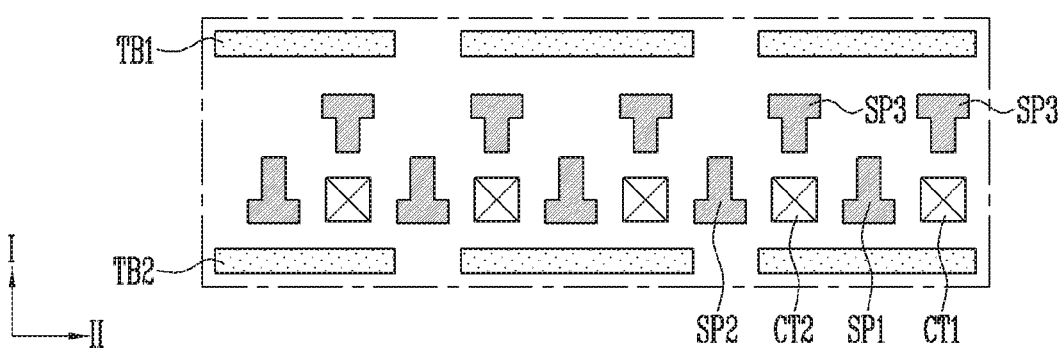
Figure 4C:
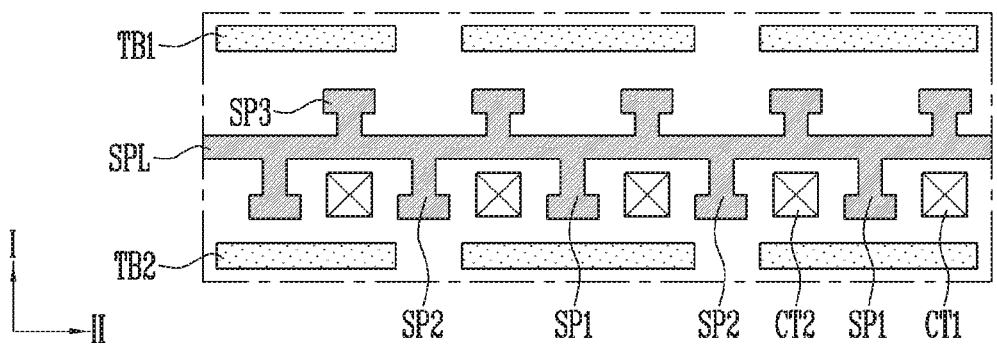
Figure 4D:
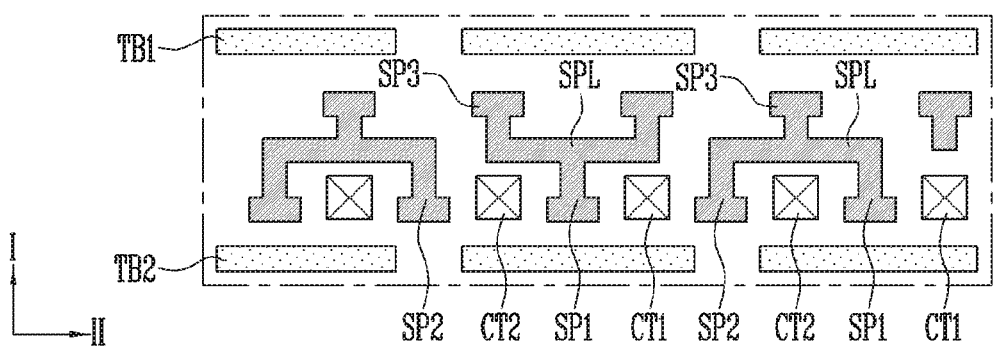

At least one of the first to third support pillars SP1 to SP3 may have a T shaped cross-sectional structure or a substantially T shaped cross-sectional structure. Thus, a stable support structure may be provided. The first to third support pillars SP1 to SP3 may be spaced apart from one another as illustrated in FIGS. 4A and 4B. As illustrated in FIGS. 4C and 4D, the first to third support pillars SP1 to SP3 may be coupled through the connection unit SPL.

Referring to FIG. 4C, the connection unit SPL may be extended longer than each of the first trench buried films TB1 and the second trench buried films TB2 in the second direction II and connect the plurality of first support pillars SP1, the plurality of second support pillars SP2, and the plurality of third support pillars SP3.

Referring to FIG. 4D, the connection unit SPL may connect two neighboring third support pillars SP3 or connect the first support pillars SP1 and the second support pillars SP2 adjacent to each other in a pair. A C, U, Y or V shaped or substantially C, U, Y or V shaped support pillar having a cross-sectional structure having an opening toward the first trench buried film TB1 may be defined by the connection unit SPL and two third support pillars SP3 coupled to one another. A C, U, Y, or a V shaped support pillar or substantially C, U, Y, or a V shaped support pillar having a cross-sectional structure having the opening toward the second trench buried film TB2 may be defined by the connection unit SPL and the first support pillar SP1 and the second support pillars SP2 coupled to one another.

Figure 5A:
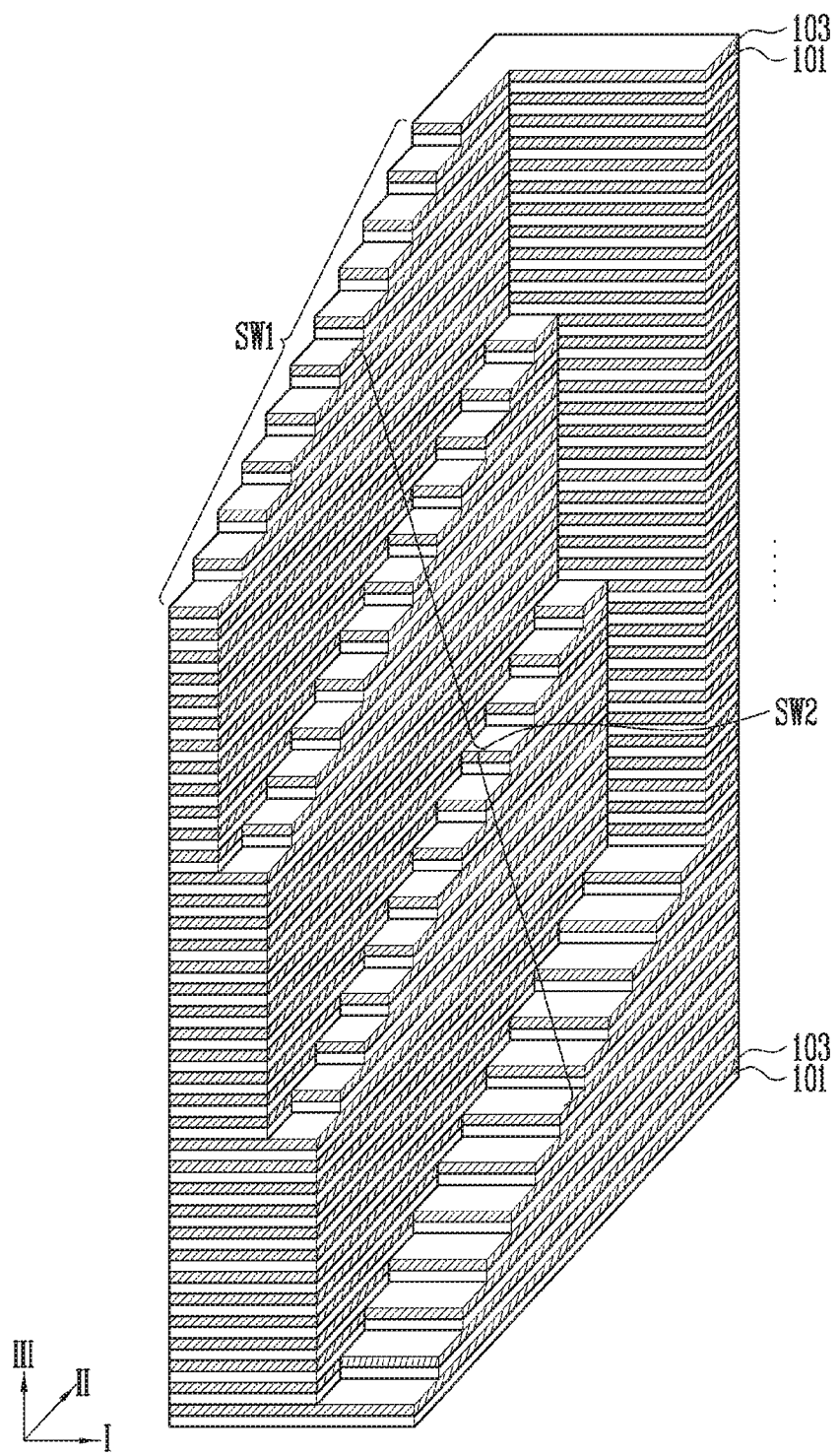
FIGS. 5A and 5B and FIGS. 6A to 6C are perspective views illustrating a manufacturing method of a semiconductor memory device according to an embodiment of the present disclosure.
Figure 5B:
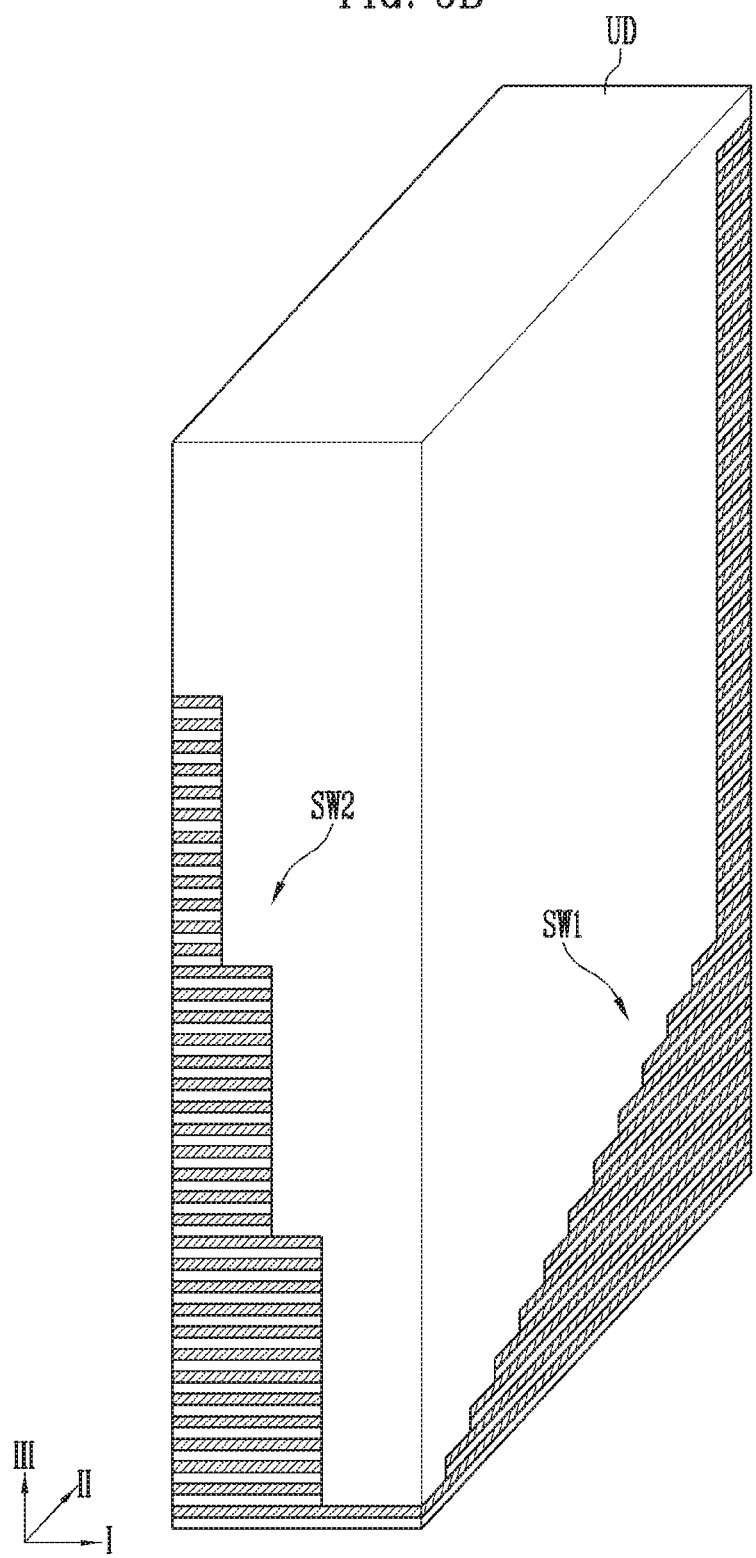
Figure 6A:
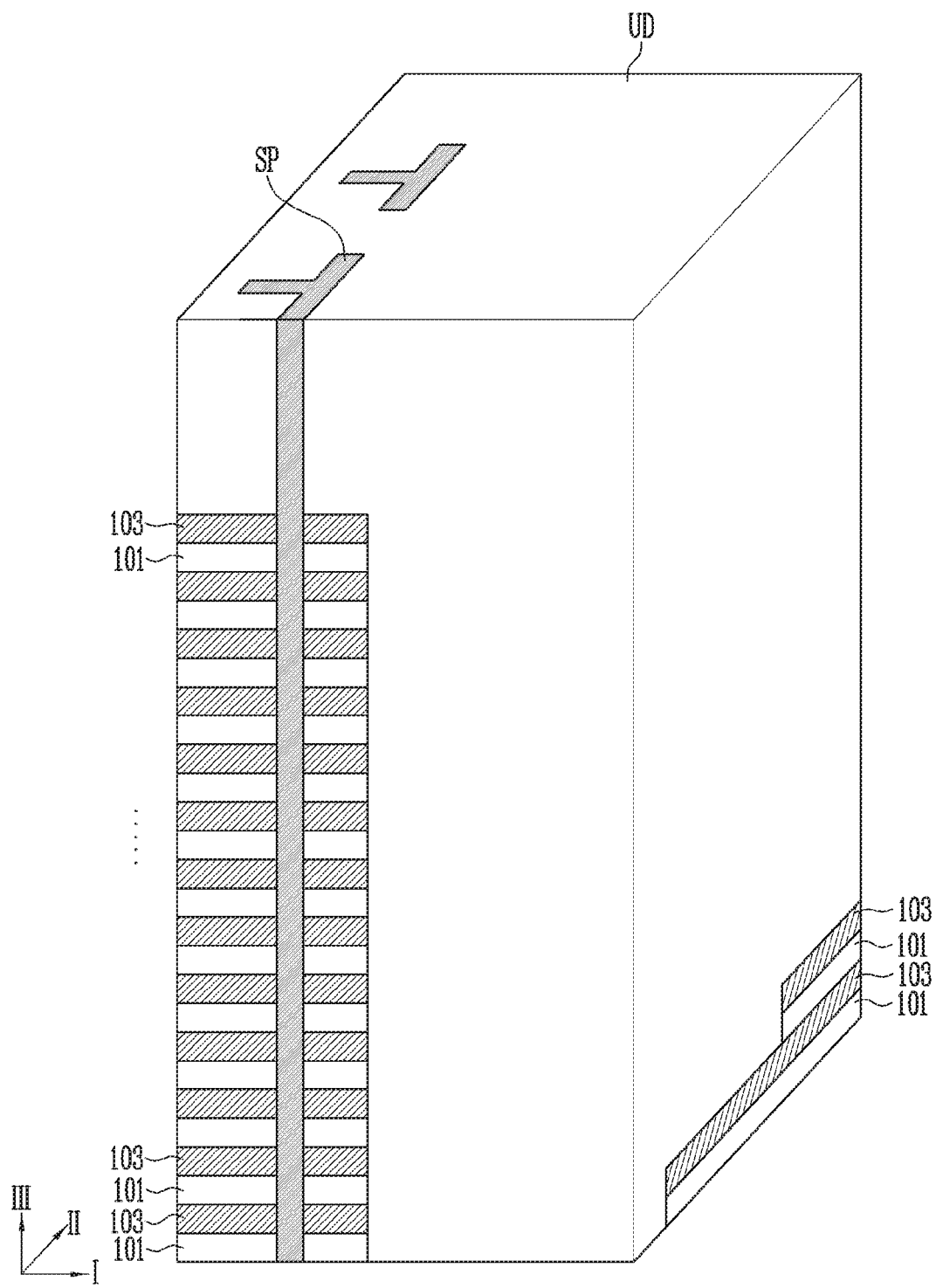
Figure 6B:
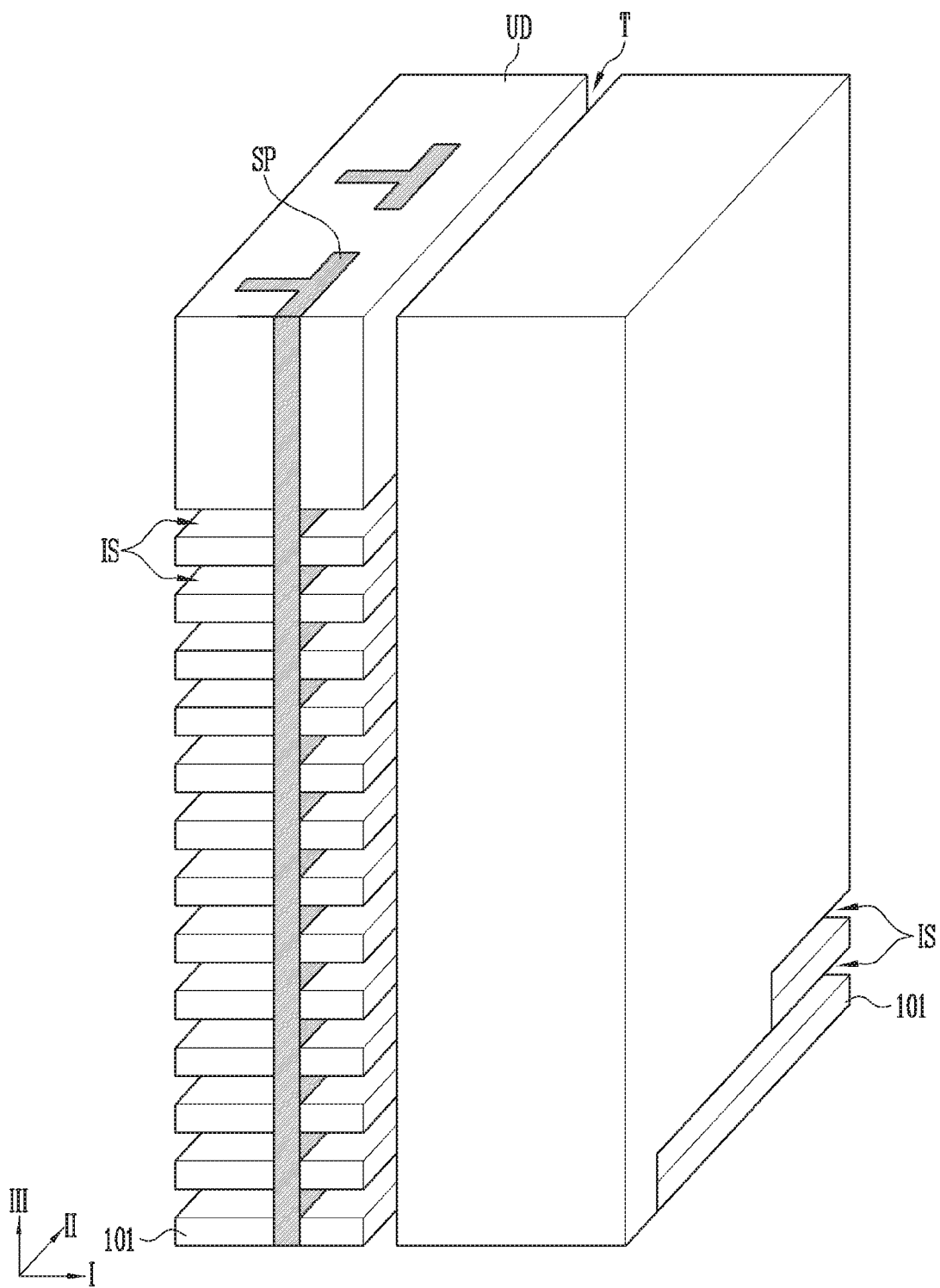
Figure 6C:
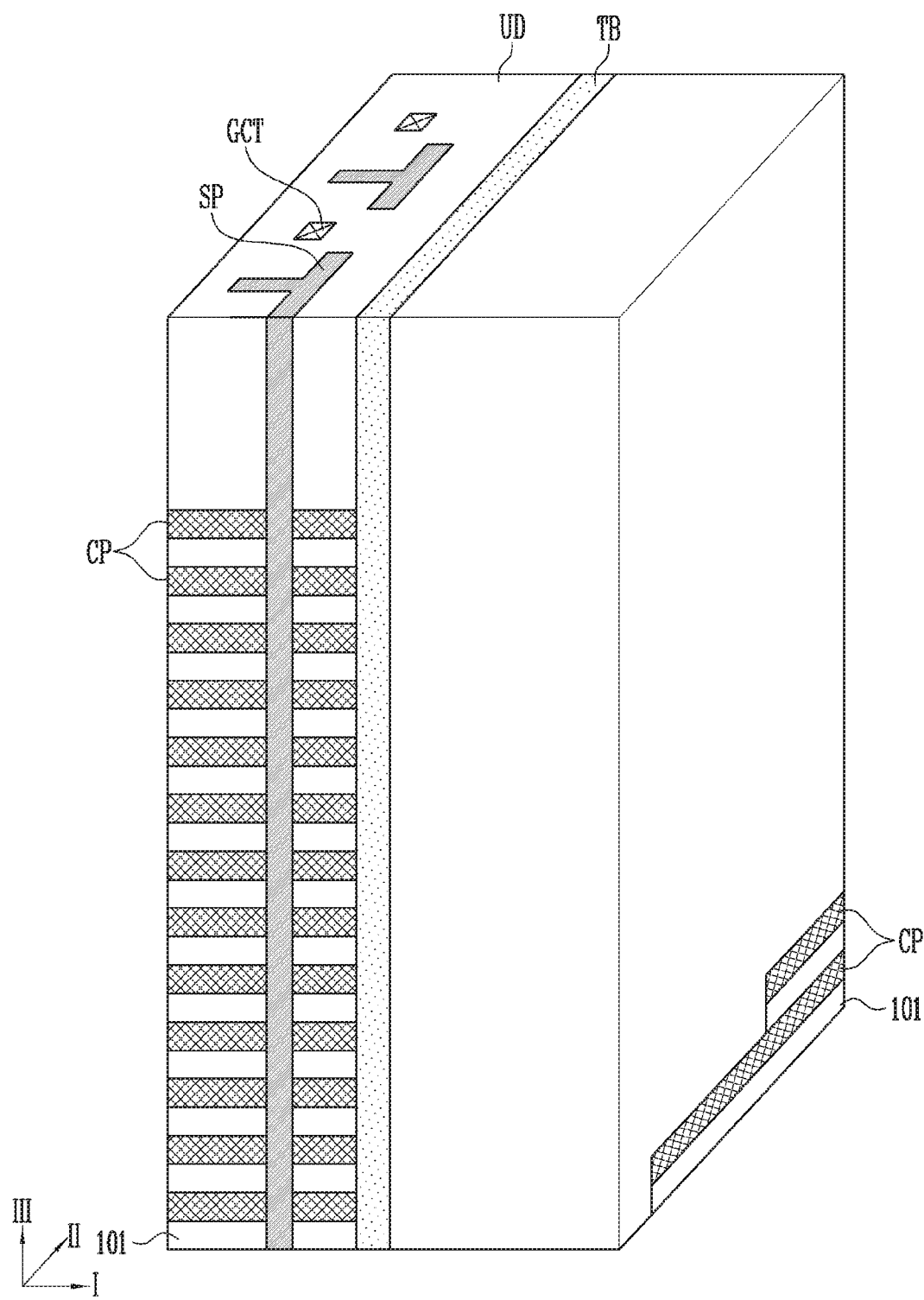

FIGS. 5A and 5B and FIGS. 6A to 6C are perspective views illustrating a manufacturing method of a semiconductor memory device according to an embodiment of the present disclosure. FIGS. 5A and 5B and FIGS. 6A to 6C are perspective views of a portion of a contact area, and FIGS. 6A to 6C are enlarged views illustrating a portion of the contact area illustrated in FIGS. 5A and 5B for the convenience of explanation.

Referring to FIG. 5A, first material films 101 and second material films 103 different from each other may be alternately stacked. The first material films 101 may be formed of an insulating material for an interlayer insulating film and the second material films 103 may be formed of an insulating material having an etch selectivity with respect to the first material films 101. Although not illustrated in FIG. 5A, the first material films 101 may be formed of a conductive material for a conductive pattern, and the second material films 103 may be formed of a conductive material having an etch selectivity to the first material films 101.

Subsequently, the first material films 101 and the second material films 103 may be patterned to form a first stepped structure SW1 and a second stepped structure SW2. The first stepped structure SW1 may include end portions arranged at a first height difference along the second direction II. The second stepped structure SW2 may include end portions arranged at a second height difference greater than the first height difference along the first direction I. The second stepped structure SW2 may be formed by sequentially recessing the first stepped structure SW1 in the first direction I by performing an etching process. The second material films 103 may be exposed through the end portions of the first stepped structure SW1 and the second stepped structure SW2. In a subsequent process, gate contact plugs may be coupled to the end portions of the first stepped structure SW1 and the second stepped structure SW2.

Referring to FIG. 5B, the upper insulating film UD may cover the first stepped structure SW1 and the second stepped structure SW2. A surface of the upper insulating film UD may be planarized by performing a planarization process.

Referring to FIG. 6A, the support pillars SP penetrating the upper insulating film UD, the first material films 101, and the second material films 103 may be formed. In the forming of the support pillars SP, the block separation film BS and the crossing separation film IP described in FIG. 2 may be simultaneously formed. The support pillars SP may have the same shape as at least one of the shapes illustrated in FIGS. 3A to 3K and FIGS. 4A to 4D in addition to the shape illustrated in FIG. 6A.

Referring to FIG. 6B, a trench T may penetrate the upper insulating film UD, the first material films 101, and the second material films 103. The trench T may have the same shape as at least one of the trench buried films TB, TB1, and TB2 described in FIGS. 2, 3A to 3K, and 4A to 4D.

Subsequently, the second material films 103 may be removed through the trench T to open interlayer spaces IS. The interlayer spaces IS may be formed between the adjacent first material films 101 or between the uppermost first material film 101 and the upper insulating film UD. The interlayer spaces IS may be opened in a state in which the first material films 101 are supported by the support pillars SP. The support pillars SP may be formed to enhance the stability of the support structure as that illustrated in FIGS. 3A to 3K and FIGS. 4A to 4D. Accordingly, according to various embodiments, the distortion of the stacked body, such as the bending of the shapes of the interlayer spaces IS, the collapse of the first material films 101, and the like may be reduced.

Referring to FIG. 6C, the conductive patterns CP may fill the interlayer spaces IS, and the trench buried film TB may fill the trench T.

Subsequently, the gate contact plugs GCT extending to penetrate the upper insulating film UD and contact the conductive patterns CP may be formed.

Figure 7:
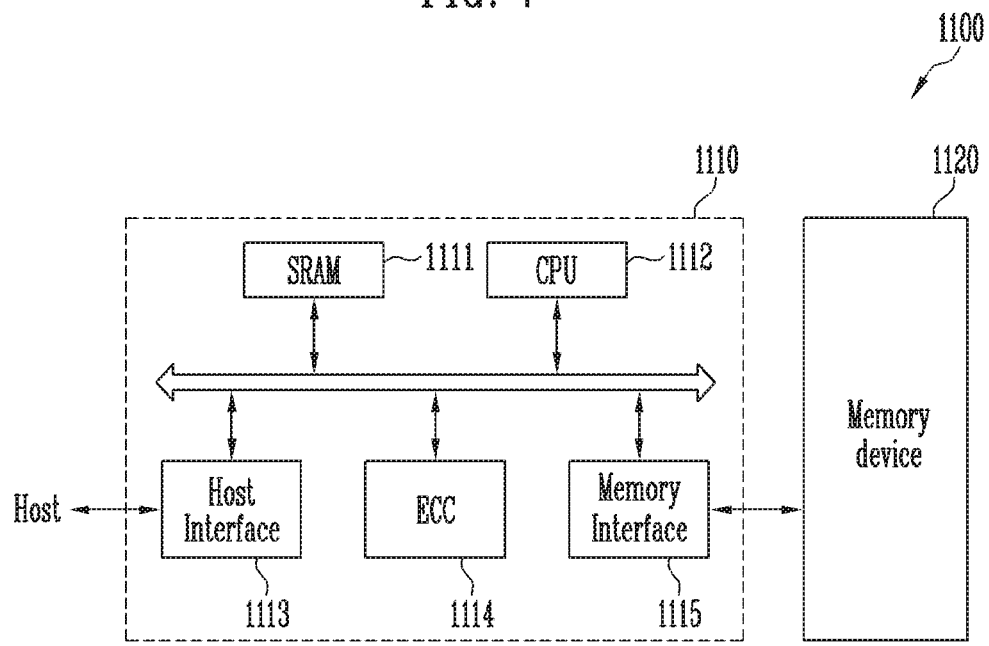
FIG. 7 is a block diagram illustrating a memory system according to an embodiment of the present disclosure.

FIG. 7 is a block diagram illustrating a memory system according to an embodiment of the present disclosure.

Referring to FIG. 7, a memory system 1100 according to an embodiment may include a memory device 1120 and a memory controller 1110.

The memory device 1120 may include at least one of the structures described in FIGS. 1A and 1C. The memory device 1120 may include the structures described above in FIG. 2. The support pillars of the memory device 1120 may include one of the structures described in FIGS. 3A to 3K and FIGS. 4A to 4D. For example, the memory device 1120 may include conductive patterns surrounding a channel film and stacked to be spaced apart from one another; a contact plug coupled to one of the conductive patterns; and a support pillar disposed in a periphery of the contact plug and having a T shaped cross-section, substantially a T shaped cross-section or a cross-sectional structure including an open one side.

The memory device 1120 may be a multi-chip package comprising a plurality of flash memory chips.

The memory controller 1110 may be configured to control the memory device 1120 and include a static random access memory (SRAM) 1111, a central processing unit (CPU) 1112, a host interface 1113, an error correction code (ECC) 1114, and a memory interface 1115. The SRAM 1111 may be used as an operation memory of the CPU 1112, the CPU 1112 may perform a control operation for data exchange of the memory controller 1110, the host interface 1113 may include a data exchange protocol in contact with a host. In addition, the ECC 1114 may detect and correct errors included in the data read from the memory device 1120, and the memory interface 1115 may perform interfacing with the memory device 1120. In addition, the memory controller 1110 may further include a read only memory (ROM) for storing code data for interfacing with the host.

The memory system 1100 described above may be a memory card of a solid state disk (SSD) in which the memory device 1120 and the controller 1100 are combined. For example, when the memory system 1100 is the SSD, the memory controller 1110 may communicate with an external source (e.g. a host) through one of various interface protocols such as universal serial bus (USB), multimedia card (MMC), peripheral component interconnection-express (PCI-E), serial advanced technology attachment (SATA), parallel advanced technology attachment (PATA), small computer small interface (SCSI), enhanced small disk interface (ESDI), integrated drive electronics (IDE) and the like.

Figure 8:
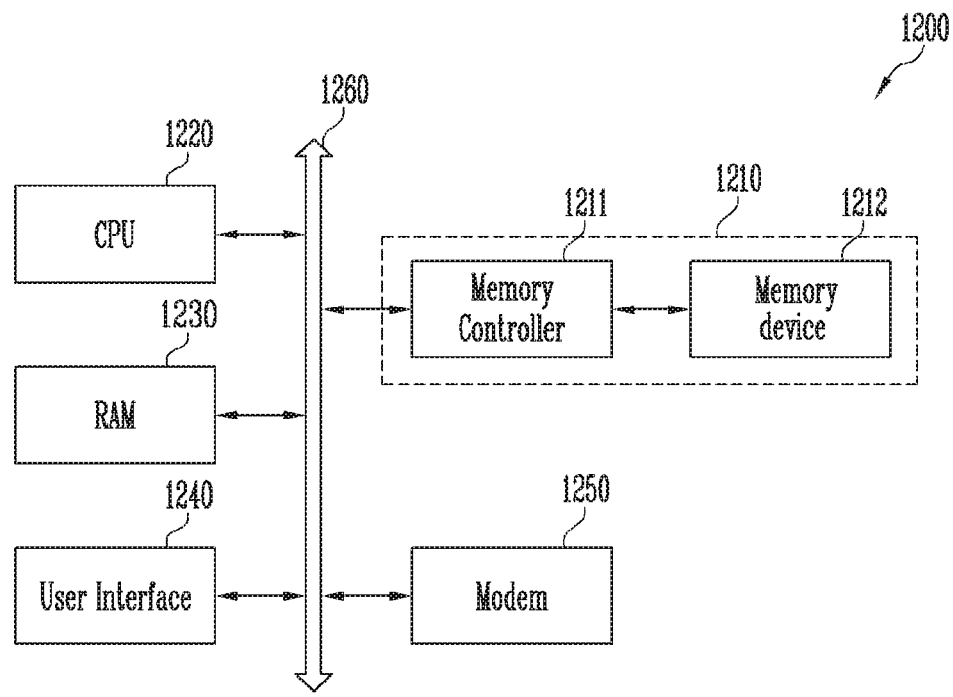
FIG. 8 is a block diagram illustrating a computing system including a memory system illustrated with reference to FIG. 7.

FIG. 8 is a block diagram illustrating a computing system including a memory system illustrated with reference to FIG. 7.

Referring to FIG. 8, the computing system 1200 according to an embodiment may include the CPU 1220 electrically connected to a system bus 1260, a random access memory (RAM) 1230, a user interface 1240, a modem 1250, a memory system 1210, and the like. In addition, when the computing system 1200 is a mobile device, a battery for supplying an operating voltage to the computing system 1200 may be further included, and an application chipset, a camera image processor (CIS), a mobile deem, and the like may be further included.

As described with reference to FIG. 7, the memory system 1210 may include a memory device 1212 and a memory controller 1211.

Embodiments may improve structural stability of a stacked body by disposing a support pillar having a T shaped cross-sectional structure, substantially a T shaped cross-sectional structure or a cross-sectional structure with an opened one side in a periphery of the contact plug.

While the various embodiments have been particularly illustrated and described with reference to examples of embodiments thereof, it is to be understood that the embodiments are not limited to the disclosed examples of embodiments. In addition, it will be understood by those of ordinary skill in the art that various that embodiments are embodied within the technical scope of the present disclosure.

What is claimed is:

1. A semiconductor device, comprising:
    conductive patterns surrounding a channel film, the conductive patterns stacked and spaced apart from one another;
    a gate contact plug coupled to one of the conductive patterns; and
    support pillars penetrating the conductive patterns in a periphery of the gate contact plug, wherein a cross-section of at least one of the support pillars is a T shape.

2. The semiconductor device of claim 1, further comprising a first trench buried film and a second trench buried film facing each other in a first direction and penetrating the conductive patterns,
    wherein the gate contact plug is disposed between the first trench buried film and the second trench buried film.

3. The semiconductor device of claim 2, wherein the support pillars comprise:
    a first support pillar and a second support pillar facing each other in a second direction intersecting the first direction with the gate contact plug interposed therebetween, and
    a third support pillar disposed between the gate contact plug and the first trench buried film.

4. The semiconductor device of claim 3, wherein a cross-section of at least one of the first to third support pillars is a T shape.

5. The semiconductor device of claim 3, wherein the first to third support pillars are coupled to one another via a connection unit disposed between the gate contact plug and the third support pillar.

6. The semiconductor device of claim 3, wherein the first to third support pillars are spaced apart from one another.

7. The semiconductor device of claim 5, wherein the connection unit extends along the second direction to be longer than the first and second trench buried films.

8. The semiconductor device of claim 3, wherein the gate contact plug is closer to the second trench buried film than the first trench buried film.

9. The semiconductor device of claim 1, wherein a cross-section of at least one of the support pillars is a bar shape extending in one direction.

10. A semiconductor device, comprising:
- conductive patterns surrounding a channel film, the conductive patterns stacked and spaced apart from one another;
- a gate contact plug coupled to one of the conductive patterns; and
- a support pillar in a cross-sectional structure having an opened one side and surrounding the gate contact plug.

11. The semiconductor device of claim 10, further comprising a first trench buried film and a second trench buried film facing each other in a first direction and penetrating the conductive patterns,
   wherein the gate contact plug is disposed between the first trench buried film and the second trench buried film.

12. The semiconductor device of claim 11, wherein the support pillar has a C, U, Y or V shape including an opened side toward the first trench buried film or the second trench buried film.

13. The semiconductor device of claim 11, wherein the support pillar comprises:
- a first support pillar and a second support pillar facing each other in a second direction intersecting the first direction with the gate contact plug interposed therebetween;
- a third support pillar disposed between the gate contact plug and the first trench buried film; and
- a connection unit disposed between the gate contact plug and the third support pillar and coupling the first support pillar and the second support pillar.

14. The semiconductor device of claim 13, wherein the connection unit extends to be coupled to the third support pillar.

15. The semiconductor device of claim 11, wherein the support pillar comprises:
- a first support pillar and a second support pillar facing each other in a second direction intersecting the first direction with the gate contact plug interposed therebetween;
- a third support pillar disposed between the gate contact plug and the first trench buried film; and
- connection units coupling the first support pillar and the third support pillar and coupling the second support pillar and the third support pillar.

* * * * *